US010007186B2

(12) United States Patent
Prochnau et al.

(10) Patent No.: US 10,007,186 B2
(45) Date of Patent: Jun. 26, 2018

(54) OPTICAL ARRANGEMENT OF A MICROLITHOGRAPHIC PROJECTION EXPOSURE APPARATUS

(71) Applicant: Carl Zeiss SMT GmbH, Oberkochen (DE)

(72) Inventors: Jens Prochnau, Oberkochen (DE); Dirk Schaffer, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days. days.

(21) Appl. No.: 15/461,853

(22) Filed: Mar. 17, 2017

(65) Prior Publication Data
US 2017/0192360 A1 Jul. 6, 2017

Related U.S. Application Data (63) Continuation of application No. PCT/EP2015/001856, filed on Sep. 17, 2015.

(30) Foreign Application Priority Data

Sep. 22, 2014 (DE) .................. 10 2014 218 969

(51) Int. Cl.
*G02B 5/08* (2006.01)
*G02B 7/182* (2006.01)
(Continued)

(52) U.S. Cl.
CPC ........ *G03F 7/70141* (2013.01); *G03F 7/7015* (2013.01); *G03F 7/70825* (2013.01)

(58) Field of Classification Search
CPC . G03F 7/70141; G03F 7/7015; G03F 7/70825
(Continued)

(56) References Cited

U.S. PATENT DOCUMENTS 4,632,523 A * 12/1986 Knohl .................. G02B 7/183
359/848
2003/0147155 A1* 8/2003 Nishikawa ............. G02B 7/022
359/819

(Continued)

FOREIGN PATENT DOCUMENTS

DE 10 2009 054 549 A1 6/2010
DE 10 2009 029 673 A1 11/2010
(Continued)

OTHER PUBLICATIONS

German Office Action, with translation thereof, for corresponding DE Appl 10 2014 218 969.1, dated May 20, 2015.
(Continued)

*Primary Examiner* — Colin Kreutzer
(74) *Attorney, Agent, or Firm* — Fish & Richardson P.C.

(57) ABSTRACT

An optical arrangement of a microlithographic projection exposure apparatus includes a mirror element having a mirror substrate, and a reflection region formed on a surface of the mirror substrate. The arrangement also includes at least one actuator configured to move the mirror element in at least one degree of freedom, and a mounting element, which acts on the mirror substrate. The mounting element alone holds the mirror element at least approximately in an equilibrium position, such that the at least one actuator is at least approximately free of forces in the equilibrium position.

20 Claims, 4 Drawing Sheets

(51) Int. Cl.
*G03B 27/54* (2006.01)
*G03F 7/20* (2006.01)

(58) Field of Classification Search
USPC .......................... 355/67; 359/846, 848, 871
See application file for complete search history.

(56) References Cited

U.S. PATENT DOCUMENTS

2004/0212794 A1  10/2004  Mizuno
2011/0267596 A1  11/2011  Muehlberger et al.
2013/0314681 A1  11/2013  Erath et al.
2015/0055112 A1   2/2015  Schaffer et al.

FOREIGN PATENT DOCUMENTS

DE   10 2011 088 735 A1    6/2012
DE   10 2012 209 309 A1   12/2013
EP          1 533 832 A1    5/2005
EP          1 806 610 A1    7/2007
JP           2002075831 A  *  3/2002
JP           2005-303206 A   10/2005
JP           2007-266511 A   10/2007
WO     WO 2011/029467 A1    3/2011
WO     WO 2013/050081 A1    4/2013

OTHER PUBLICATIONS

International Search Report and Written Opinion for corresponding PCT Appl No. PCT/EP2015/001856, dated Nov. 26, 2015.

* cited by examiner

OPTICAL ARRANGEMENT OF A MICROLITHOGRAPHIC PROJECTION EXPOSURE APPARATUS

CROSS-REFERENCE TO RELATED APPLICATION

The present application is a continuation of, and claims benefit under 35 USC 120 to, international application PCT/EP2015/001856, filed Sep. 17, 2015, which claims benefit under 35 USC 119 of German Application No. 10 2014 218 969.1, filed Sep. 22, 2014. The entire disclosure of international application PCT/EP2015/001856 and German Application No. 10 2014 218 969.1 are incorporated by reference herein.

FIELD

The disclosure relates to an optical arrangement of a microlithographic projection exposure apparatus which may be configured, for example, for wavelengths in the extreme ultraviolet spectral range (EUV). The optical arrangement may be contained in an illumination system or a lens of such an apparatus.

BACKGROUND

Microlithographic projection exposure apparatuses are used to transfer structures arranged on a mask to a light-sensitive layer such as a photoresist, for example. The light-sensitive layer is usually situated on a wafer or some other substrate. The projection exposure apparatus typically includes a light source, an illumination system, which conditions projection light generated by the light source and directs it onto the mask, and a lens, which images the mask illuminated by the projection light onto the light-sensitive layer.

The shorter the wavelength of the projection light, the smaller the structures can be produced on the light-sensitive layer with the aid of the projection exposure apparatus. The most recent generation of projection exposure apparatuses uses projection light having a centre wavelength of approximately 13.5 nm, which is thus in the extreme ultraviolet spectral range (EUV). Such apparatuses are often referred to as EUV projection exposure apparatuses.

However, there are no optical materials which have a sufficiently high transmissivity for such short wavelengths. Therefore, in EUV projection exposure apparatuses the lens elements and other refractive optical elements that are customary at longer wavelengths are replaced by mirrors, and the mask therefore contains a pattern of reflective structures. The mirrors include a mirror substrate having a reflection region, which is formed on a surface of the mirror substrate and in which the mirror substrate bears a reflective coating. The mirrors are often fixed in support frames that are connected to a rigid frame structure of the lens or of the illumination system via actuators. The entire, inherently rigid assembly including a mirror and, if appropriate, supporting frames fixed thereto, or other components, is referred to hereinafter as mirror element.

The mirror elements of the illumination system direct the projection light onto the mask; the mirror elements of the lens image the region illuminated on the mask onto the light-sensitive layer.

In order to accomplish this with the desired accuracy, the reflection regions of the mirror elements have to be aligned precisely with one another in all six degrees of freedom. Electrically actuable actuators are usually used for positioning and aligning the mirror elements.

EUV projection exposure apparatuses having a large numerical aperture involve mirror elements having a large diameter. Such mirror elements are costly to produce and, owing to their high inherent weight, make it more difficult to implement mounting and actuation with little deformation. Since the mirror element is not an ideal rigid body, the shape of the mirror substrate can vary, e.g. in the long term on account of material degradations and in the short term as a result of the influence of forces and moments that act on the mirror substrate during actuation.

The mirror substrate for mirror elements of an EUV projection exposure apparatus usually consists of a material which has a very low or even vanishing coefficient of thermal expansion at the operating temperature. Such materials may be e.g. glass ceramics such as Zerodur® or titanium silicate glasses such as ULE®. Nevertheless, deformations that are caused thermally can occur in the mirror substrates, the deformations arising as a result of a temperature gradient within the substrate on account of absorption of part of the projection light.

Since the surface accuracy of the reflection region has to be maintained down to a few nanometers during the operation of an EUV projection exposure apparatus, extreme demands with regard to mechanical precision have to be placed on the mounting and actuation of the mirror elements as well. The mounting has to be configured in such a way that undesired and parasitic forces or moments are reduced as much as possible. In order to achieve a high mechanical precision, all factors of potential mechanical disturbances such as, for example, vibrations, air pressure fluctuations or temperature fluctuations and gravitational influences and also material properties have to be taken into account.

In EUV projection exposure apparatuses, each mirror element is usually actuated via three actuators which act on the mirror element and which simultaneously constitute mounting elements. The forces exerted by the actuators can be subdivided into a portion that is responsible only for the movement of the mirror element during positioning and alignment, and a portion that compensates for the weight force of the mirror element. The effective lines of the XY- and Z-forces for actuation and of the weight compensation force meet at the force application point of the respective actuators. Such mirror elements are known from US 2015/0055112 A1, for example. The mounting elements here act on a circumferential surface of the mirror substrate.

EP 1 806 610 A1 discloses a mirror element of an EUV projection exposure apparatus in which the mirror is enclosed in a support frame and the arrangement of the three force application points on the support frame is chosen such that the weight force of the mirror element is distributed uniformly along the three force application points. In the case of force application points distributed uniformly over the circumference of the mirror and in the case of a non-rotationally symmetrical mirror substrate, this is achieved via compensation weights on the support frame. In this case, the effective line of the weight force intersects the optically effective reflection region.

On account of specific boundary conditions such as, for example, construction space conflicts, desired dynamic or thermal properties, this type of mounting can prove to be difficult to implement and restrict the range of possible optical designs. Specifically, the three actuators or other mirror elements arranged on the circumference of the mirror element occupy considerable construction space if the mirror element has a large diameter. Moreover, the mirror element can deform in a manner that is difficult to foresee in the event of temperature changes owing to the fixed clamping at the three mounting elements in the vicinity of its reflection region.

WO 2011/029467 A1 discloses using a mount for the mirror substrate, which mount is carried by actuators and supports the mirror substrate only at a single bearing surface. In order to minimize parasitic forces and moments and resultant deformations of the mirror substrate, the mirror element is fixed at a mounting element of the mount in such a way that the effective line of the gravitational force passes through the geometric centre of the bearing surface at which the mirror substrate touches the mounting element. The mirror element is thus supported by the mount directly below its centre of gravity.

SUMMARY

The disclosure seeks to provide, for an illumination system or a lens of a projection exposure apparatus, an optical arrangement which contains a mirror element which deforms particularly little and nevertheless takes up little structural space in the lens or the illumination system.

In one aspect, the disclosure provides an optical arrangement of a microlithographic projection exposure apparatus, including a mirror element having a mirror substrate and a reflection region formed on a surface of the mirror substrate. The arrangement furthermore includes at least one actuator configured to move the mirror element in at least one degree of freedom, and a mounting element, which acts on the mirror substrate. According to the disclosure, the mounting element alone holds the mirror element at least approximately in an equilibrium position, such that the at least one actuator is at least approximately free of forces in the equilibrium position.

The disclosure is based on the consideration that the use of a single supporting location for complete weight compensation makes it possible to prevent permanent external force actions on the mirror element by the at least one actuator. Consequently, the actuators transmit forces to the mirror element only during actuation, the forces additionally being very small. The risk that the mirror element and, in particular, the mirror substrate contained therein, in the vicinity of the optically effective reflection region, will deform during actuation is correspondingly low.

Lorentz actuators are often used for actuation. In the case of these actuators, an electric current proportional to the generated force flows even in the rest state. The current flow leads to heating of the actuators, the heating being dependent on the magnitude of the generated force. Since the at least one actuator is at least approximately free of forces according to the disclosure, no or at most very little heating of the mirror element occurs as a result of quiescent currents in the actuator. The outlay for maintaining the setpoint temperature in the lens or the illumination system also decreases as a result.

If thermally induced deformations nevertheless arise, they can be better predicted owing to the support at only a single supporting location and can be compensated for more easily via other correction measures, e.g. an actuation of the same or a different mirror element.

Since the at least one actuator only has to transmit small forces to the mirror element, it can moreover be embodied in a lighter and more compact fashion. Therefore, overall less structural space in the lens or the illumination system is required for the mounting and actuation of the mirror element.

According to the disclosure, the effective line of the weight force which takes effect in the centre of gravity of the mirror element does not intersect the optically usable reflection region. If a deformation of the mirror element occurs as a result of the compensation of the weight force at only one supporting location, the part with the greatest deformations is not situated in direct proximity to the optically usable reflection region, but rather at a distance therefrom. Therefore, deformations caused by the support of the weight force affect the optical effect of the mirror element to a lesser extent than if the weight force were compensated for e.g. directly below or above the reflection region.

If the mirror substrate at least substantially has the shape of a plate, the effects on the reflection region are particularly small if the effective line of the weight force is situated at a distance from the reflection region which is greater than the minimum thickness of the plate.

In general, the mirror substrate may bear a coating in the reflection region, the coating reflecting as much projection light as possible. In principle, however, for specific angles of incidence and wavelengths of the projection light, the mirror substrate can partly reflect the impinging projection light even without a coating. The reflection region is then merely a region on which projection light is incident during operation and which generally is distinguished by a particularly high optical quality.

The mounting element exerts on the mirror substrate a mounting force which is equal to the weight force in terms of absolute value and acts in the opposite direction. In order to achieve completely moment-free mounting of the mirror element, the effective line of the mounting force coincides with the effective line of the weight force.

Often, however, slight deviations of the effective lines of the mounting force and of the weight force and thus smaller residual moments are tolerable. The deviations of the effective lines are regarded as tolerably small if the effective line of the mounting force runs at a distance from the effective line of the weight force that is less than 0.1 times a longitudinal extent which is the largest longitudinal extent of the mirror element in all normal planes with respect to the effective line of the weight force. In this case, the effective line of the mounting force can run parallel or at an inclination with respect to the effective line of the weight force.

In the cases in which the effective line of the mounting force does not coincide exactly with the effective line of the weight force, it is provided that the at least one actuator is able to act on the mirror substrate in such a way that the mirror element is held in equilibrium. In this case, the at least one actuator exerts a small mounting moment on the mirror substrate that is in the opposite direction to the small residual moment and is equal thereto in terms of absolute value.

In the case described above, it is expedient if the at least one actuator is situated at a distance from the reflection region that is greater than the minimum thickness of the plate. Deformations of the reflection region that are caused owing to the mounting moment exerted by the actuator can be reduced as a result.

In order to achieve an additional damping of forces and a decoupling of moments and oscillations, it is advantageous if the mounting force is a resultant force of an electric or magnetic field. In this way, by way of example, it is possible to prevent the transmission of oscillations to the mirror element which were caused by moving parts of the projection exposure apparatus.

In order to mount the mirror element in equilibrium with only one mounting element, the mirror element can have a displacement mechanism, on which a compensation weight is arranged displaceably and is fixable at different positions with the aid of a screw or some other fixing element. With the aid of the compensation weight, the centre of gravity of the mirror element can be shifted in such a way that the mirror element assumes the desired equilibrium position.

The disclosure additionally relates to a lens and to an illumination system of a microlithographic projection exposure apparatus including an optical arrangement described above.

BRIEF DESCRIPTION OF THE DRAWINGS

Further features and advantages of the disclosure will become apparent from the following description of the embodiments with reference to the drawings, in which.

DESCRIPTION OF PREFERRED EMBODIMENTS

1. Basic Construction of the Projection Exposure Apparatus

Figure 1:
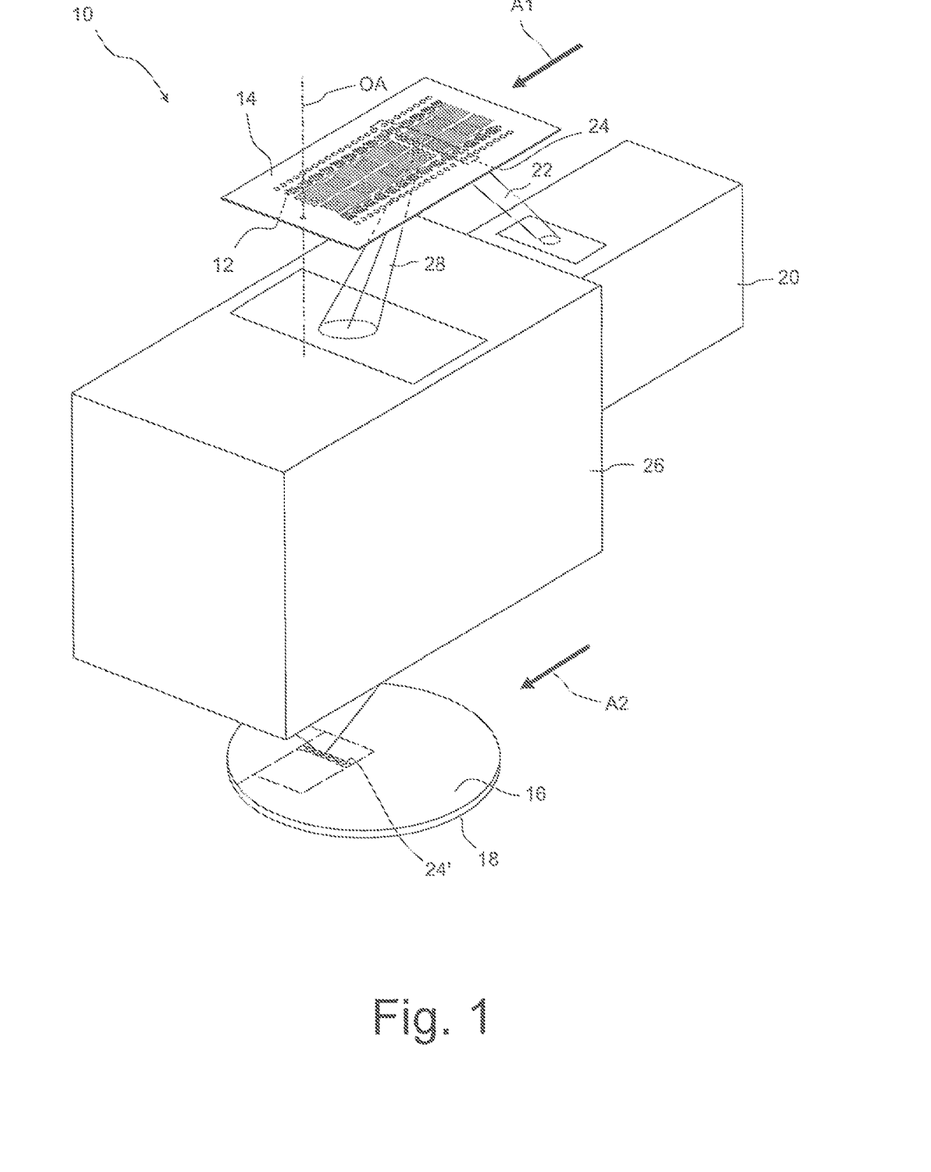
FIG. 1 is a perspective view of a schematic microlithographic EUV projection exposure apparatus including an illumination system and a lens.

FIG. 1 shows, in a perspective and highly schematic illustration which is not to scale, the basic construction of a microlithographic projection exposure apparatus according to the disclosure, the apparatus being designated in its entirety by 10. The projection exposure apparatus 10 serves to project reflective structures 12 arranged on a side—facing downwards in FIG. 1—of a mask 14 onto a light-sensitive layer 16. The light-sensitive layer 16, which can be, in particular, a photoresist (also called resist), is carried by a wafer 18 or some other substrate.

The projection exposure apparatus 10 includes an illumination system 20, which illuminates that side of the mask 14 which is provided with the structures 12 with EUV light 22. A range of between 5 nm and 30 nm, in particular, is appropriate as wavelength for the EUV light 22. In the embodiment illustrated, the centre wavelength of the EUV light 22 is approximately 13.5 nm. The EUV light 22 illuminates an illumination field 24 on the downwardly facing side of the mask 14, the illumination field having the geometry of a ring segment here.

The projection exposure apparatus 10 furthermore includes a lens 26, which generates on the light-sensitive layer 16 a reduced image 24' of the structures 12 lying in the region of the illumination field 24. The lens 26 has an optical axis OA, which coincides with the axis of symmetry of the ring-segment-shaped illumination field 24, and is thus situated outside the illumination field 24.

The lens 26 is designed for scanning operation in which the mask 14 is displaced synchronously with the wafer 18 during the exposure of the light-sensitive layer 16. These displacing movements of the mask 14 and of the wafer 18 are indicated by arrows A1, A2 in FIG. 1. During an exposure of the light-sensitive layer 16, the illumination field 24 thus sweeps over the mask 14 in a scanner-like manner, as a result of which even relatively large contiguous structure regions can be projected onto the light-sensitive layer 16. The ratio of the speeds at which the mask 14 and the wafer 18 are displaced is in this case equal to the imaging scale β of the lens 26. In the embodiment illustrated, the image 24' generated by the lens 20 is reduced ($|\beta|<1$) and erect ($\beta>0$), for which reason the wafer 18 is displaced more slowly than the mask 14, but in the same direction.

Light beams proceed from each point in the illumination field 24 which is situated in an object plane of the lens 26, the light beams entering into the lens 26. The latter has the effect that the entering light beams converge in an image plane of the lens 26 at field points. The field points in the object plane from which the light beams proceed, and the field points in the image plane in which the light beams converge again are in this case in a relationship with one another which is designated as optical conjugation.

For an individual point in the centre of the illumination field 24, such a light beam is indicated schematically and designated 28. In this case, the aperture angle of the light beam 28 upon entering into the lens 26 is a measure of the numerical aperture NA thereof. On account of the reduced imaging, the image-side numerical aperture NA of the lens 26 is enlarged by the reciprocal of the imaging scale β.

Figure 2:
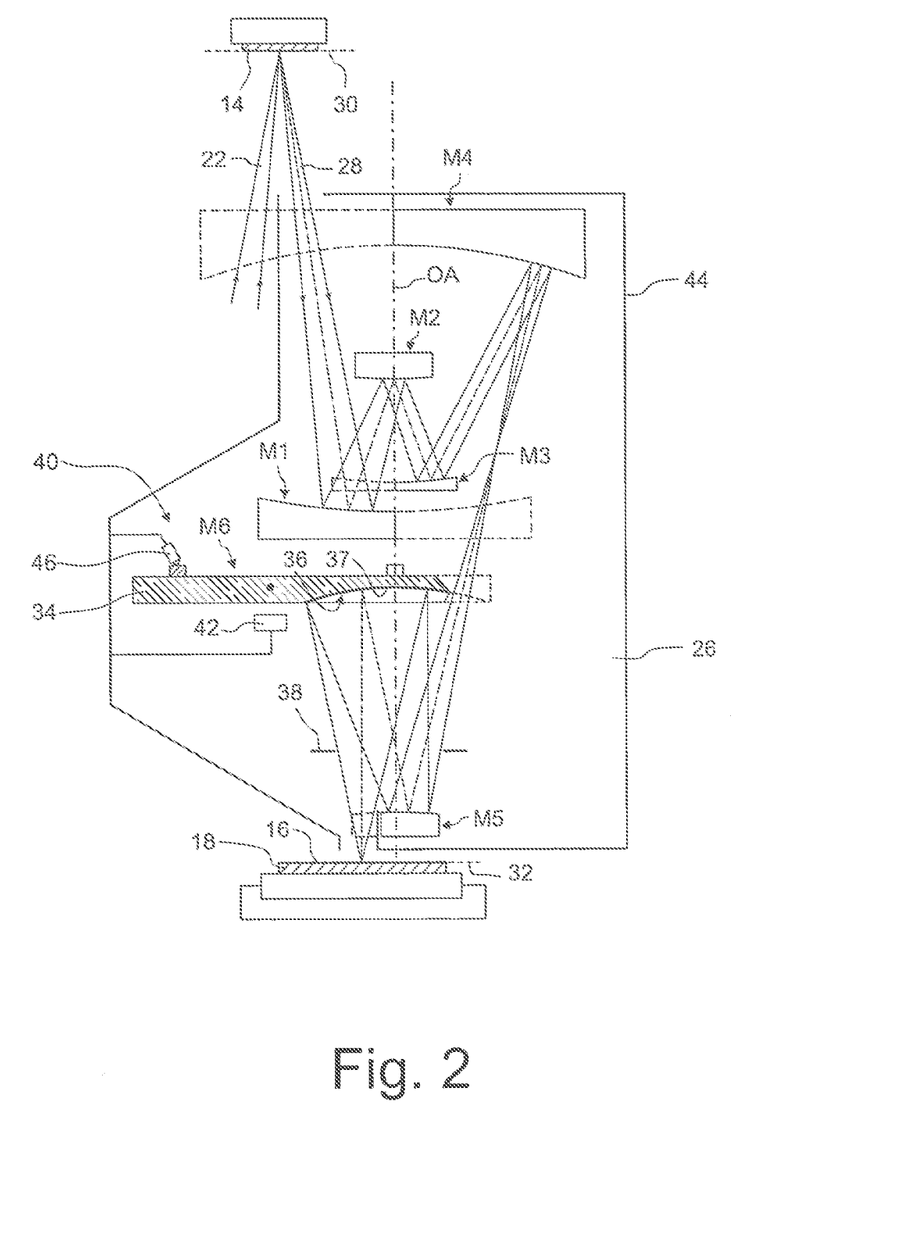
FIG. 2 is a meridional section through the lens of the projection exposure apparatus shown in FIG. 1 with a mirror element in accordance with a first embodiment of the disclosure.

FIG. 2 shows important components of the lens 26 likewise schematically and not to scale in a meridional section. Between the object plane indicated at 30 and the image plane indicated at 32, a total of six mirror elements M1 to M6 are arranged along an optical axis OA. Each of the mirror elements M1 to M6 includes a mirror substrate 34 and a reflection region 36, as is shown by way of example for the mirror element M6. The light beam 28 proceeding from a point in the object plane 30 firstly impinges on a concave first mirror element M1, is reflected back onto a convex second mirror element M2, impinges on a concaves third mirror element M3, is reflected back onto a concave fourth mirror element M4 and then impinges on a convex fifth mirror element M5, which directs the EUV light back onto a concave sixth mirror element M6. The latter finally focuses the light beam 28 into a conjugate image point in the image plane 32.

If the mirror elements M1 to M6 were supplemented by the parts indicated by dashed lines in FIG. 2, then the reflection regions 36 of the mirror elements thus supplemented would be rotationally symmetrical with respect to the optical axis OA of the lens 26. As can readily be discerned, the beam path described above could not be realized with such completely rotationally symmetrical reflection regions 36, however, since the mirror units M1 to M6 would then partly block the light path. Therefore, the mirror elements M1 to M6 have the shapes indicated by solid lines.

A shading stop 38 is arranged between the mirror elements M5 and M6.

2. Optical Arrangement with Mirror Element M6

The mirror element M6 is part of an optical arrangement 40 according to the disclosure, which is described in greater detail below with reference to FIGS. 2 to 6. FIG. 2 shows the optical arrangement 40 in this case in the installation situation in the lens 26. The optical arrangement 40 includes, besides the mirror element M6 having mirror substrate 34 and reflection region 36, a first actuator 46 illustrated schematically and a mounting element 42 likewise illustrated schematically, which are rigidly fixed to a support structure 44 of the lens 26. The mirror element M6 is supported by the mounting element 42 in the vicinity of its centre of gravity S, such that the mounting element 42 alone holds the mirror element M6 at least approximately in an equilibrium position and the actuator 46, which is designed to move the mirror element M6 in at least one degree of freedom, is free of forces in the equilibrium position.

Figure 3:
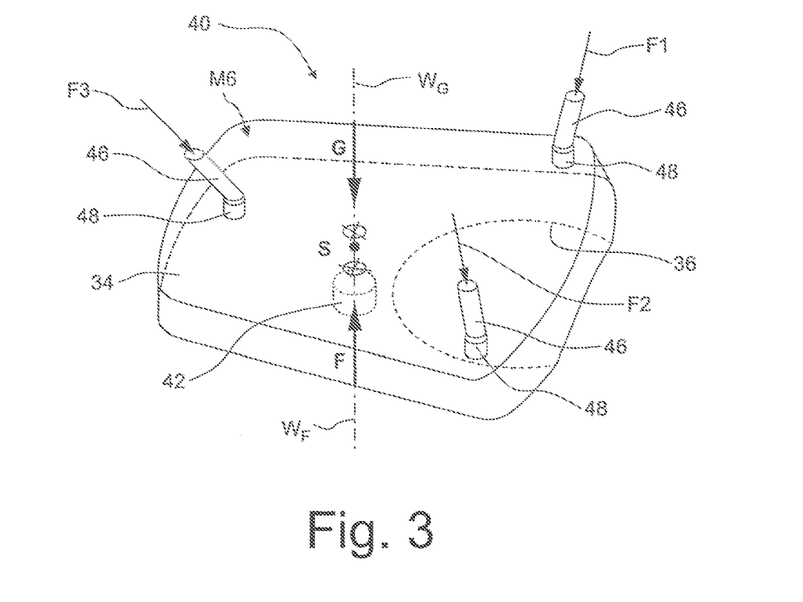
FIG. 3 is a perspective view of the mirror element shown in FIG. 2.

FIG. 3 illustrates the optical arrangement 40 from FIG. 2 in an enlarged manner and in perspective view. It is evident that the optical arrangement 40 furthermore includes two further actuators 46 illustrated schematically, which are fixed to the support structure 44 and which act on the mirror substrate 34 and are likewise designed to precisely align the mirror element M6.

The mirror substrate 34 of the mirror element M6 is substantially embodied in a plate-shaped fashion and bears, on a surface which is directed downwards in FIG. 3 and is shaped particularly precisely, a coating 37 which is reflective to the projection light 22 and which defines the optically effective reflection region 36 of the mirror element M6. At the opposite side of the mirror substrate 34 relative to the reflection region 36, three actuation elements 48 are adhesively bonded or secured in a manner fixed against movement in some other way such that they can transmit forces F1 to F3 exerted by the actuators 46 to the mirror substrate 34. Alternatively, the actuation elements 48 can be embodied integrally as part of the mirror substrate 34. Furthermore, an embodiment is conceivable in which the actuation elements 48 are arranged on a circumferential surface of the plate-shaped mirror substrate 34 or on the same side of the mirror substrate 34 on which the reflection region 36 is situated.

A resultant weight force G having an effective line $W_G$ running through the centre of gravity S of the mirror element M6 acts on the mirror element M6. FIG. 2 furthermore indicates schematically the mounting element 42, which exerts a mounting force F on the mirror substrate 34, the mounting force taking effect along an effective line $W_F$ in the opposite direction to the weight force G. In the present embodiment, the mounting force F is a resultant force of an electric or magnetic field, such that the mirror element M6 is supported in a contactless manner.

In order to achieve a completely moment-free support by the mounting force F, the mounting element 42 in this embodiment is arranged in such a way that the effective line $W_F$ runs exactly through the centre of gravity S of the mirror element M6 and thereby coincides with the effective line $W_G$ of the weight force G. Therefore, the mirror element M6 is in equilibrium. Consequently, the actuators 46 transmit forces to the mirror substrate 34 only during an actuation. Therefore, the risk that the mirror element M6 and, in particular, the mirror substrate 34 contained therein, in the vicinity of the optically effective reflection region 36, will deform during the actuation or heat up as a result of actuation energy dissipated in the actuators 46 is low.

In the present embodiment, the actuators 46 are embodied as electromagnetic Lorentz actuators. In the case of these actuators, an electric current proportional to the generated force flows even in the rest state. The current flow leads to heating of the actuators 46, the heating being dependent on the magnitude of the generated force. Since the actuators 46 transmit forces only during a movement of the mirror element M6, no or at most very little heating of the mirror element M6 occurs as a result of quiescent currents in the actuators 46. The outlay for maintaining the setpoint temperature in the lens 26 also decreases as a result.

If thermally induced deformations nevertheless arise, they can be better predicted owing to the support at only a single supporting location and can be compensated for more easily via other correction measures, e.g. an actuation of the mirror element M6 or a different mirror element M1 to M5.

Figure 4:
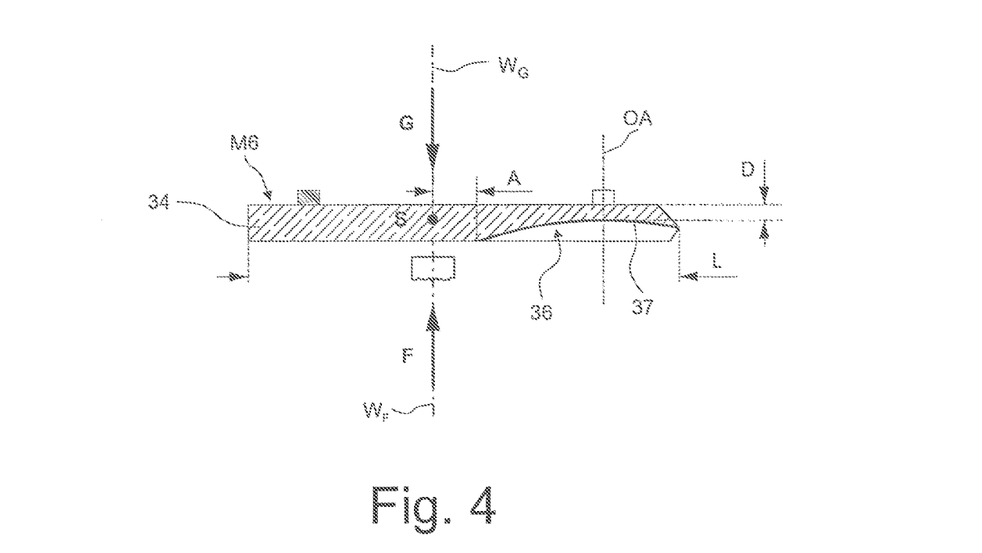
FIG. 4 is a lateral section through the mirror element shown in FIG. 2.

Since the actuators 46 only have to transmit small forces to the mirror element, they can be embodied in a particularly light and compact fashion. Therefore, overall less structural space in the lens 26 is required for the mounting and actuation of the mirror element M6. FIG. 4 shows a sectional view in a plane of symmetry of the optical arrangement from FIG. 3, the plane of symmetry containing the centre of gravity S and also the optical axis OA. The mirror substrate 34 has its maximum longitudinal extent L in the plane of symmetry and has its minimum thickness D in the reflection region 36. The reflection region 36 is arranged relative to the centre of gravity S in such a way that the effective line $W_G$ of the weight force G which takes effect in the centre of gravity S of the mirror element M6 does not intersect the reflection region 36. This prevents the mounting force F that counteracts the weight force G—particularly during an actuation of the actuators 46—from resulting in an unacceptable deformation of the mirror substrate 34 in the vicinity of the reflection region 36.

In the present embodiment, the distance A between the effective line $W_G$ of the weight force G and the optically usable reflection region 36 is greater than the minimum thickness D of the mirror substrate 34. As a result, the mounting force F acts on the mirror substrate 34 particularly far away from the reflection region 36.

Figure 5:
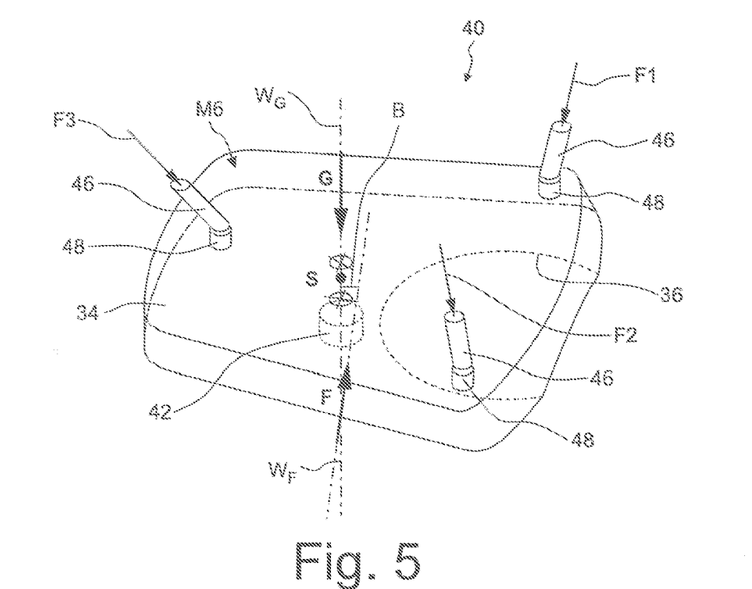
FIG. 5 is a perspective view—based on FIG. 3—of a mirror element in accordance with a second embodiment, in which the effective lines of the weight force and of the mounting force do not coincide exactly.

Preferably, the actuation elements 48 are likewise situated at a distance, not specifically designated, from the reflection region 36 that is greater than the minimum thickness D of the mirror substrate 34. In the case of such a large distance, the risk that unacceptable deformations of the reflection region 36 as a result of the moments and/or forces exerted on the mirror substrate 34 by the actuators 46 will occur is correspondingly low. FIG. 5 shows, in a perspective illustration, a second embodiment of an optical arrangement 40, in which the effective line $W_F$ of the mounting force F runs at a small distance B from the effective line $W_G$ of the weight force G. Since the effective line $W_F$ of the mounting force F is furthermore inclined slightly with respect to the effective line $W_G$ of the weight force G, the mounting force F has a first component, which runs parallel to the weight force G, and a second component, which runs perpendicular thereto and is significantly smaller than the first component in terms of absolute value as a result of the slight inclination of the effective line $W_G$. A residual moment arises as a result of the distance B between the pair of forces formed by the weight force G and the first component of the mounting force F. Preferably, the minimum distance B between the effective lines $W_F$ and $W_G$ is less than 0.1 times the longitudinal extent L of the mirror substrate 34, such that the residual moment is very small in terms of absolute value. As a result, both the residual moment and the second component of the mounting force F can be taken up by the actuators 46.

Alternatively, the effective line $W_F$ can be displaced slightly parallel to the effective line $W_G$ only by the distance B, as a result of which only a small residual moment but no second force component arises. Here, too, the portion of the small residual moment arising as a result of the distance B is taken up by the actuators 46, but no force component need be compensated for by the actuators 46.

Since the actuators 46 only have to compensate for small residual moments and/or force components, the contribution thereof to the deformation of the mirror substrate 34 is small.

Figure 6:
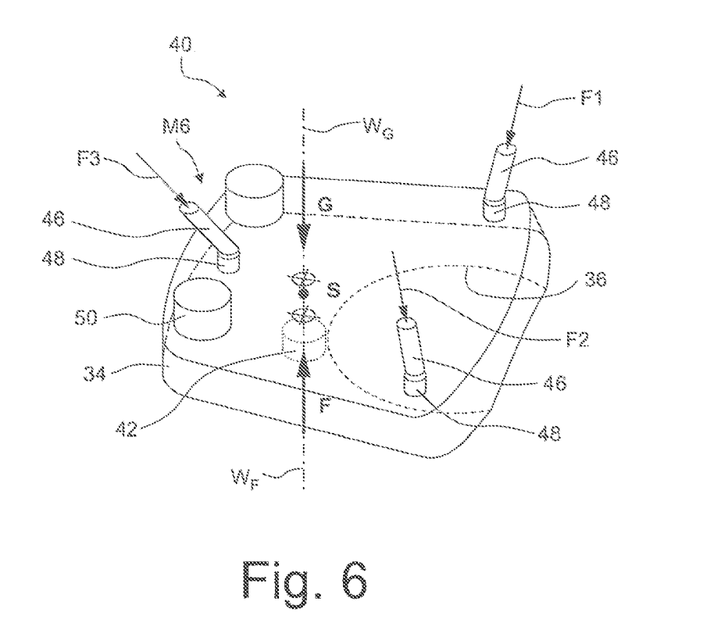
FIG. 6 is a perspective view—based on FIG. 3—of a mirror element in accordance with a third embodiment, in which the mirror substrate bears compensation weights displacing the centre of gravity.

FIG. 6 shows, in a perspective illustration, a third embodiment, in which the position of the centre of gravity S is set via compensation weights 50 in such a way that the effective lines $W_G$ and $W_F$ of the weight force and of the mounting force, respectively, coincide as completely as possible. The compensation weights 50 can firstly be freely displaceable on the surface of the mirror substrate 34 and, after the adjustment, can be fixed thereto e.g. by adhesive bonding. As an alternative thereto, a displacement mechanism is also appropriate which includes e.g. one or a plurality of rails on which the compensation weights 50 can be displaced on the mirror substrate 34 and then be fixed via fixing screws or other securing elements.

The described construction of the optical arrangement including the mirror element M6 can, of course, also be applied to the other mirror elements M1 to M5.

What is claimed is:

1. An optical arrangement, comprising:
    a mirror element comprising a mirror substrate and a reflection region supported by the mirror substrate;
    an actuator configured to move the mirror element in at least one degree of freedom; and
    a mounting element configured to act on the mirror substrate,
    wherein:
        the mounting element alone holds the mirror element at least approximately in an equilibrium position so that the actuator is at least approximately free of forces in the equilibrium position;
        an effective line of a weight force in a center of gravity of the mirror element does not intersect the reflection region;
        the mirror substrate is at least substantially shaped as a plate; and
        a distance between the effective line of the weight force and the reflection region is greater than a minimum thickness of the mirror substrate.

2. The optical arrangement of claim 1, wherein the mirror substrate bears a reflective material in the reflection region.

3. The optical arrangement of claim 2, wherein the mounting element is configured to exert a mounting force on the mirror element, and an effective line of the mounting force coincides with the effective line of the weight force.

4. The optical arrangement of claim 3, wherein the arrangement comprises a plurality of actuators.

5. The optical arrangement of claim 4, wherein each of the plurality of actuators is configured to move the mirror element in at least one degree of freedom.

6. The optical arrangement of claim 1, wherein the mounting element is configured to exert a mounting force on the mirror element, and an effective line of the mounting force coincides with the effective line of the weight force.

7. The optical arrangement of claim 6, wherein the arrangement comprises a plurality of actuators.

8. The optical arrangement of claim 7, wherein each of the plurality of actuators is configured to move the mirror element in at least one degree of freedom.

9. The optical arrangement of claim 1, wherein:
    the mounting element is configured to exert a mounting force on the mirror element; and
    an effective line of the mounting force runs within the substrate at a distance from the effective line of the weight force which is less than 0.1 times a maximum longitudinal extent of the mirror element in all normal planes with respect to the effective line of the weight force.

10. The optical arrangement of claim 9, wherein the arrangement comprises a plurality of actuators.

11. The optical arrangement of claim 10, wherein each of the plurality of actuators is configured to move the mirror element in at least one degree of freedom.

12. The optical arrangement of claim 1, wherein the arrangement comprises a plurality of actuators.

13. The optical arrangement of claim 12, wherein each of the plurality of actuators is configured to move the mirror element in at least one degree of freedom.

14. A lens having an object plane and an image plane, the lens comprising:
    an optical arrangement according to claim 1,
    wherein the lens is configured to image an object in the object plane into the image plane.

15. An illumination system, comprising:
    an optical arrangement according to claim 1,
    wherein the illumination is configured to illuminate an illumination plane.

16. An apparatus, comprising:
    an illumination system; and
    a lens having an object plane and an image plane,
    wherein:
        the lens is configured to image an object in the object plane into the image plane; and
        at least one member selected from the group consisting of the illumination system and the lens comprises an optical arrangement according to claim 1.

17. A method of using a projection exposure apparatus comprising an illumination system and a lens, the method comprising:
    using the illumination system to illuminate an object in an object plane of the lens; and
    using the lens to image an illuminated portion of the object into an image plane of the lens,
    wherein at least one member selected from the group consisting of the illumination system and the lens comprises an optical arrangement according to claim 1.

18. An optical arrangement, comprising:
    a mirror element comprising a mirror substrate and a reflection region supported by the mirror substrate;
    an actuator configured to move the mirror element in at least one degree of freedom; and
    a mounting element configured to act on the mirror substrate,
    wherein:
        the mounting element alone holds the mirror in a position so that the actuator is at least approximately free of forces;
        an effective line of a weight force in a center of gravity of the mirror element does not intersect the reflection region;
        the mirror substrate is at least substantially shaped as a plate; and
        the effective line of the weight force is a distance from the reflection region that is greater than a minimum thickness of the mirror substrate.

19. The optical arrangement of claim 18, wherein the mirror substrate bears a reflective material in the reflection region.

20. The optical arrangement of claim 19, wherein the mounting element is configured to exert a mounting force on the mirror element, and an effective line of the mounting force coincides with the effective line of the weight force.

* * * * *

UNITED STATES PATENT AND TRADEMARK OFFICE
CERTIFICATE OF CORRECTION

PATENT NO. : 10,007,186 B2  
APPLICATION NO. : 15/461853  
DATED : June 26, 2018  
INVENTOR(S) : Jens Prochnau and Dirk Schaffer Page 1 of 1

It is certified that error appears in the above-identified patent and that said Letters Patent is hereby corrected as shown below:

On the Title Page

Item (Notice), Line 3: After "0 days." delete "days.".

Signed and Sealed this  
Eighteenth Day of September, 2018

Andrei Iancu  
*Director of the United States Patent and Trademark Office*